United States Patent
Wang et al.

(10) Patent No.: US 9,553,140 B2
(45) Date of Patent: Jan. 24, 2017

(54) INTEGRATED CIRCUIT AND METHOD OF FABRICATING THE SAME

(71) Applicant: TAIWAN SEMICONDUCTOR MANUFACTURING CO., LTD., Hsinchu (TW)

(72) Inventors: Hung-Sen Wang, Tainan (TW); Shih-Chi Yang, Tainan (TW); Kuo-Ching Chang, Changhua County (TW); Wei-Sho Hung, Yunlin County (TW); Ho-Chun Liou, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/088,057

(22) Filed: Mar. 31, 2016

(65) Prior Publication Data

US 2016/0218171 A1   Jul. 28, 2016

Related U.S. Application Data

(62) Division of application No. 14/292,507, filed on May 30, 2014, now Pat. No. 9,331,136.

(51) Int. Cl.
*H01L 31/058* (2006.01)
*H01L 29/66* (2006.01)
*H01L 49/02* (2006.01)
*H01L 27/06* (2006.01)
*H01L 29/06* (2006.01)
*H01L 21/02* (2006.01)
*H01L 21/762* (2006.01)
*H01L 21/768* (2006.01)

(52) U.S. Cl.
CPC ......... *H01L 28/20* (2013.01); *H01L 21/02595* (2013.01); *H01L 21/762* (2013.01); *H01L 21/76877* (2013.01); *H01L 27/0629* (2013.01); *H01L 27/0635* (2013.01); *H01L 29/0649* (2013.01)

(58) Field of Classification Search
None
See application file for complete search history.

(56) References Cited

U.S. PATENT DOCUMENTS

| | | | | |
|---|---|---|---|---|
| 5,448,103 A * | 9/1995 | de Wit | ............... | H01L 27/0802 257/379 |
| 2012/0181612 A1* | 7/2012 | Yang | ............... | H01L 27/0629 257/364 |
| 2014/0268990 A1* | 9/2014 | Hong | ............... | G11C 13/0004 365/148 |

* cited by examiner

*Primary Examiner* — Calvin Choi
(74) *Attorney, Agent, or Firm* — Maschoff Brennan

(57) ABSTRACT

An integrated circuit and a method of fabricating the integrated circuit are provided. In various embodiments, the integrated circuit includes a substrate and a polysilicon resistor. The polysilicon resistor is disposed on the substrate. The polysilicon resistor has at least one positive TCR portion and at least one negative TCR portion. The positive TCR portion is adjacent to the negative TCR portion, and the positive TCR portion is in direct contact with the negative TCR portion.

20 Claims, 6 Drawing Sheets

INTEGRATED CIRCUIT AND METHOD OF FABRICATING THE SAME

REFERENCE TO RELATED APPLICATION

The present application is a divisional application of U.S. application Ser. No. 14/292,507, filed May 30, 2014, which is hereby incorporated by reference in its entirety.

BACKGROUND

The semiconductor integrated circuit (IC) industry has experienced rapid growth in recent years. Technological advances in IC materials and design have produced generations of ICs where each generation has smaller and more complex circuits than the previous generation. Therefore, these advances have increased the complexity of processing and manufacturing ICs and, for these advances to be realized, similar developments in IC processing and manufacturing are needed.

Semiconductor resistors could be fabricated and integrated into an IC to provide various functions and further enhance performance of the IC. Requirements in IC processing and manufacturing have become more challenging for providing an IC with multi-functions and advanced performances. It is desirable for such semiconductor resistors to have a low temperature coefficient of resistance (TCR) while also having a high resistance. Therefore, specific materials are generally required in fabricating the semiconductor resistor, and also some additional process steps are required to integrate the semiconductor resistor with other devices such as metal-oxide-semiconductor (MOS) transistors in the IC. Accordingly, multiple operations of film deposition, lithography, and/or etching operations are required to form the semiconductor resistors from the materials.

As a result, there are needs in IC materials and design to improve integrated circuits and methods of fabricating thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
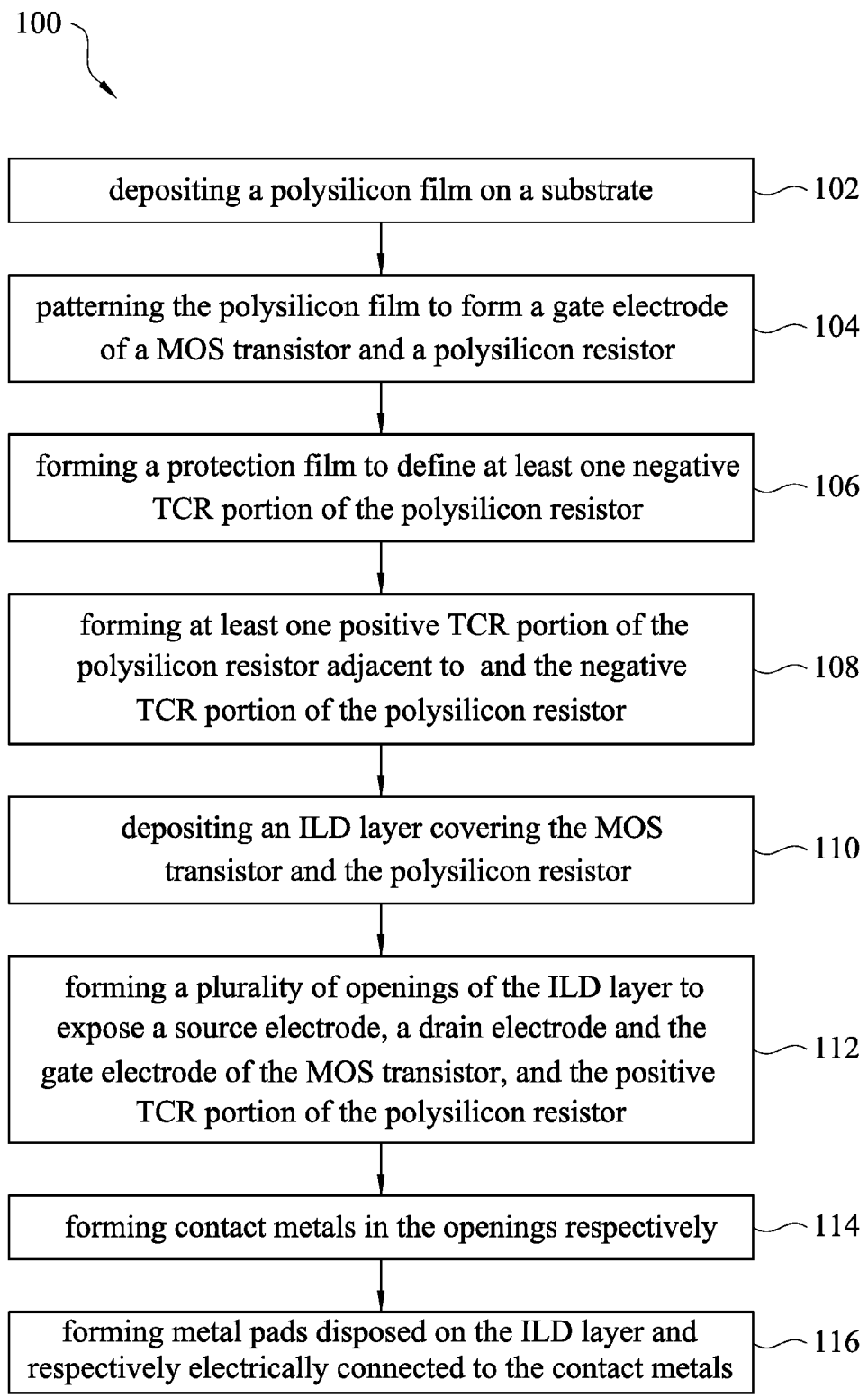
FIG. 1 is a flowchart illustrating a method of fabricating an integrated circuit according to various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The singular forms "a," "an" and "the" used herein include plural referents unless the context clearly dictates otherwise. Therefore, reference to, for example, a liner layer includes embodiments having two or more such liner layers, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

As aforementioned, it is desirable for such semiconductor resistors to have a low TCR while also having a high resistance. Therefore, special materials are generally required in fabricating the semiconductor resistor, and extra process steps are also required to integrate the semiconductor resistor with other devices such as MOS transistors in the IC. Accordingly, multiple film deposition, lithography, and/or etching operations are generally required to form the semiconductor resistors from different materials. However, such techniques can be costly and time consuming because they utilize multiple deposition, lithography, and/or etch steps to form resistors from different materials. In this regard, an integrated circuit and a method of fabricating the integrated circuit are provided according to various embodiments of the present disclosure.

FIG. 1 is a flowchart illustrating a method 100 of fabricating the integrated circuit according to various embodiments of the present disclosure. The method 100 begins with block 102 in which a polysilicon film is deposited on a substrate. The substrate could be a semiconductor substrate including single crystalline silicon that has been slightly doped with n-type or p-type dopants. Alternatively, the substrate could be a semiconductor substrate formed upon an insulation layer to create silicon-on-insulator (SOI) devices. The polysilicon film could be deposited by depositing polycrystalline silicon in any suitable depositing processes. The method 100 continues with block 104 in which the polysilicon film is patterned to form a gate electrode of a MOS transistor and a polysilicon resistor. It should be noticed that the gate electrode of the MOS transistor and the polysilicon resistor is formed simultaneously during this operation. The method 100 also includes forming a protection film to define at least one negative TCR portion of the polysilicon resistor as shown in block 106. The method 100 continues with block 108 in which at least one positive TCR portion of the polysilicon resistor is formed adjacent to the negative TCR portion of the polysilicon resistor. In various embodiments of the present disclosure, the method 100 further includes depositing an ILD layer covering the MOS transistor and the polysilicon resistor as shown in block 110. The method 100 further includes forming a plurality of openings of the ILD layer to expose a source electrode, a drain electrode and the gate electrode of the MOS transistor, and the positive TCR portion of the polysilicon resistor as shown in block 112. The method 100 further includes forming contact metals in the openings respectively as shown in block 114. The method 100 further includes forming metal pads disposed on the ILD layer and respectively electrically connected to the contact metals as shown in block 116. The details of the methods 100 are further illustrated in following FIGS. 2-8 and described in following paragraphs.

Figure 2:
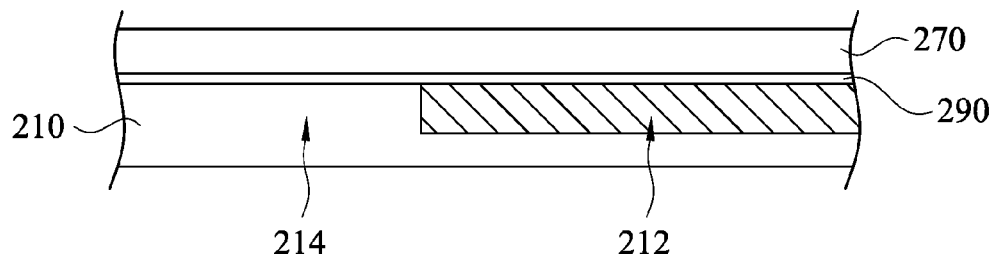
FIG. 2 is a schematic view of at least a portion of the substrate in an intermediate stage of the method of fabricating the integrated circuit according to various embodiments of the present disclosure.

FIG. 2 is a schematic view of at least a portion of the substrate in an intermediate stage of the method of fabricating the integrated circuit according to various embodiments of the present disclosure. Referring to FIG. 2, a polysilicon film 270 is deposited on a substrate 210. The substrate 210 could be a semiconductor substrate including single crystalline silicon that has been slightly doped with n-type or p-type dopants. The polysilicon film 270 could be deposited by depositing polycrystalline silicon in any suitable depositing processes, including but not limited to, atomic layer deposition (ALD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), high temperature oxide deposition (HTO), low temperature oxide deposition (LTO), limited reaction processing CVD (LRPCVD). As illustrated in FIG. 2, in various embodiments of the present disclosure, the substrate further includes a shallow trench isolation region 212 and an active region 214. The active region 214 is a region for a MOS transistor to be form thereon in following operations, and the shallow trench isolation region 212 is a region for a polysilicon resistor to be formed thereon in following operations. The shallow trench isolation region 212 is formed by etching a trench in the substrate 210 and thereafter filling the trench with the dielectric material. The dielectric material could be silicon oxide or silicon nitride. In various embodiments of the present disclosure, a gate dielectric layer 290 is further formed between the polysilicon film 270 and the semiconductor substrate 210. Examples of suitable materials for use in the gate dielectric layer 290 include but are not limited to thermally grown silicon dioxide ($SiO_2$), deposited $SiO_2$, or a high-k dielectric such as hafnium oxide ($HfO_2$) deposited by sputter deposition or atomic layer deposition. As used herein, the term "high-k dielectric" refers to dielectrics having a dielectric constant, k, greater than about 4.0, which is higher than the k value of $SiO_2$. The gate dielectric layer 290 could also include a high-k dielectric material. The high-k material can be defined as a dielectric material having its dielectric constant greater than about 3.9, that of a thermal silicon oxide. For example, the high-k dielectric material could include hafnium oxide ($HfO_2$), which has a dielectric constant that is in a range from approximately 18 to approximately 40. Alternatively, the high-k material could include one of $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof.

Figure 3:
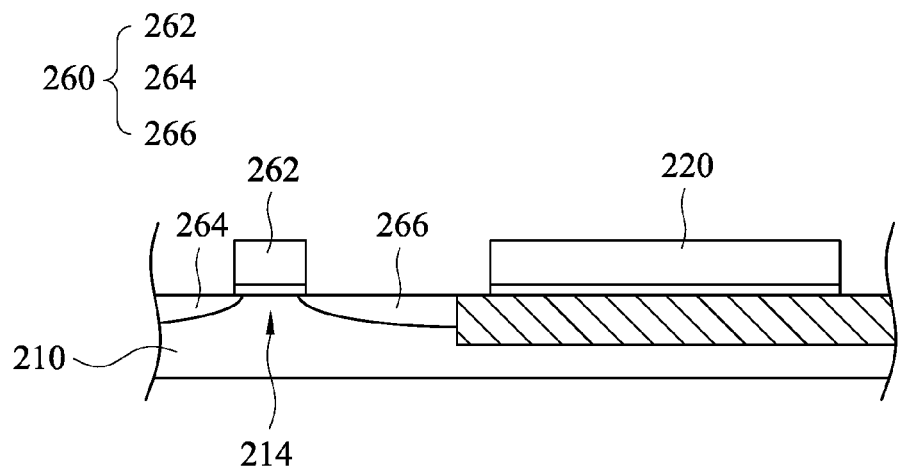
FIG. 3 is a schematic view of the substrate shown in FIG. 2 in a subsequent stage of the method of fabricating the integrated circuit according to various embodiments of the present disclosure.

FIG. 3 is a schematic view of the substrate shown in FIG. 2 in a subsequent stage of the method of fabricating the integrated circuit according to various embodiments of the present disclosure. Referring to FIG. 3, after the operation of depositing the polysilicon film 270 on the substrate 210, the polysilicon film 270 is patterned to form a gate electrode 262 of a MOS transistor 260 and a polysilicon resistor 220. For example, the polysilicon film 270 could be patterned to define the gate electrode 262 of the MOS transistor 260 and the polysilicon resistor 220 by using lithography and an anisotropic etch technique such as reactive ion etching (RIE). It should be noticed that the gate electrode 262 of the MOS transistor 260 and the polysilicon resistor 220 is formed simultaneously during this operation. In other words, no additional photo mask is required for forming the polysilicon resistor 220 since the polysilicon resistor 220 could be formed simultaneously with the gate electrode 262 of the MOS transistor 260. In addition, the process described is highly feasible using existing methods, as it is compatible with existing CMOS processes. As shown in FIG. 3, the gate dielectric layer 290 could be also patterned along with the electrode 262 of the MOS transistor 260 and the polysilicon resistor 220, or alternatively, the etch can be terminated before the gate dielectric layer 290 is removed from opposite sides of the electrode 262 of the MOS transistor 260 and the polysilicon resistor 220. In addition, dielectric spacers can optionally be formed upon the sidewall surfaces of the electrode 262 of the MOS transistor 260 and/or the polysilicon resistor 220 (not shown). As illustrated in FIG. 3, in various embodiments of the present disclosure, the substrate 210 further includes the shallow trench isolation region 212 and the active region 214, and the gate electrode 262 of the MOS transistor 260 is formed on the active region 214 and the polysilicon resistor 220 is formed on the shallow trench isolation region 212. The shallow trench isolation region 212 formed in the substrate 210 could ensure that the polysilicon resistor 220 is isolated from the MOS transistor 260 on the active areas 214. Therefore, the performance of the polysilicon resistor 220 could be further improved. Also as illustrated in FIG. 3, a source electrode 264 and a drain electrode 266 could be formed in the active region 214 of the substrate 210 by one or more ion implantation processes known in the art. For example, the source electrode 264 and/or the drain electrode 266 could be formed by doping with a P-type dopant such as boron in the active region 214. Alternatively, the source electrode 264 and/or the drain electrode 266 could be formed by doping with an N-type dopant such as arsenic or phosphorous. The source electrode 264 and the drain electrode 266 could be formed in substrate 210 on the opposite sides of the gate electrode 262 through the implantation of n-type dopants into an NFET section of the substrate 210 and p-type dopants into a PFET section of the substrate 210 in two separate steps using masks.

Figure 4:
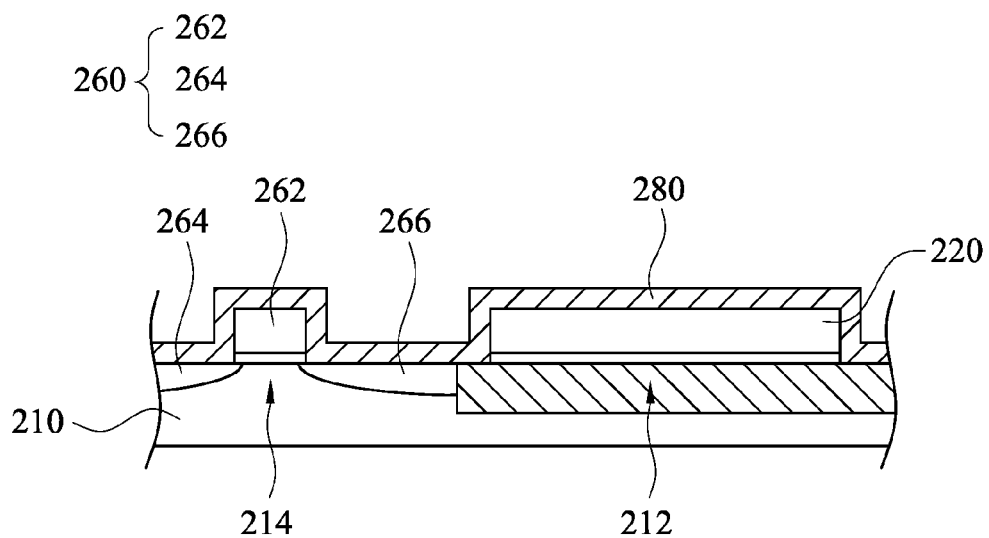
FIG. 4 is a schematic view of the substrate shown in FIG. 3 in a subsequent stage of the method of fabricating the integrated circuit according to various embodiments of the present disclosure.
Figure 5:
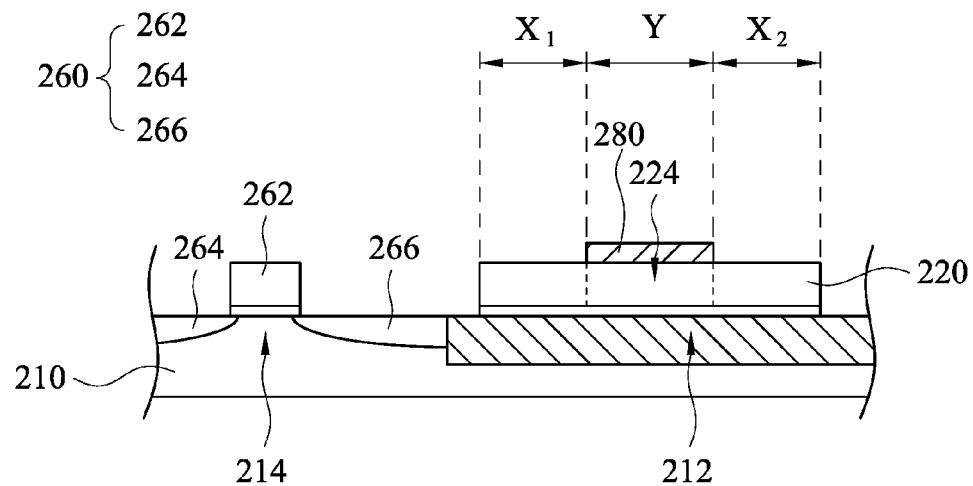
FIG. 5 is a schematic view of the substrate shown in FIG. 4 in a subsequent stage of the method of fabricating the integrated circuit according to various embodiments of the present disclosure.

FIG. 4 is a schematic view of the substrate shown in FIG. 3 in a subsequent stage of the method of fabricating the integrated circuit according to various embodiments of the present disclosure. FIG. 5 is a schematic view of the substrate shown in FIG. 4 in a subsequent stage of the method of fabricating the integrated circuit according to various embodiments of the present disclosure. Referring to FIGS. 4 and 5, after the operation of patterning the polysilicon film 270 to form the gate electrode 262 of the MOS transistor 260 and the polysilicon resistor 220, a protection film 280 is formed to define at least one negative temperature coefficient of resistivity (TCR) portion 224 of the polysilicon resistor 220. TCR is a measurement of the effect a change in temperature has on the resistance of a structure. A TCR of less than 0 (negative TCR) indicates that the resistance of the structure decreases as the structure's temperature is increased. In contrast, a TCR of greater than 0 (positive TCR) indicates that the resistance of the structure increases as the structure's temperature is increased. As illustrated in FIG. 5, the negative TCR portion 224 of the polysilicon resistor 220 is a portion of the polysilicon resistor 220 which is covered by the protection film 280. Therefore, the portion of the polysilicon resistor 220 covered by the protection film 280 would be protected without being affected by following process such as salicidation process. The portion of the polysilicon resistor 220 covered by the protection film 280 retains intrinsic property of polysilicon and has a TCR less than 0. Accordingly, the negative TCR portion 224 of the polysilicon resistor 220 is defined. In various embodiments of the present disclosure, as illustrated in FIG. 4, a protection film 280 is deposited to cover the gate electrode 262 of the MOS transistor 260 and the polysilicon resistor 220. The protection film 280 could be a RPO (resist protective oxide) film, which is commonly formed over various structures and regions to protect the same during subsequent processing operations performed on the other structures and regions of the semiconductor substrate. The RPO film can be deposited by any suitable deposition technique, including but not limited to, atomic layer deposition (ALD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), high temperature oxide deposition (HTO), low temperature oxide deposition (LTO), limited reaction processing CVD (LRPCVD), metalorganic chemical vapor deposition (MOCVD), molecular beam epitaxy (MBE), physical vapor deposition, sputtering, plating, evaporation, spin-on-coating, ion beam deposition, electron beam deposition, laser assisted deposition, and chemical solution deposition. As shown in FIG. 5, after the operation of the protection film 280 is deposited, the protection film 280 is litho-etched to cover the negative TCR portion 224 of the polysilicon resistor 220. Therefore, the pattern of the negative TCR portion 224 of the polysilicon resistor 220 could be precisely controlled according to various requirements. As illustrated in FIG. 5, a length Y of the negative TCR portion 224 of the polysilicon resistor 220 is defined by litho-etching the protection film 280. On the other hand, the other portions without being covered by the litho-etched protection film 280 are exposed, and therefore could be, for example, salicided during the subsequent salicidation process.

Figure 6:
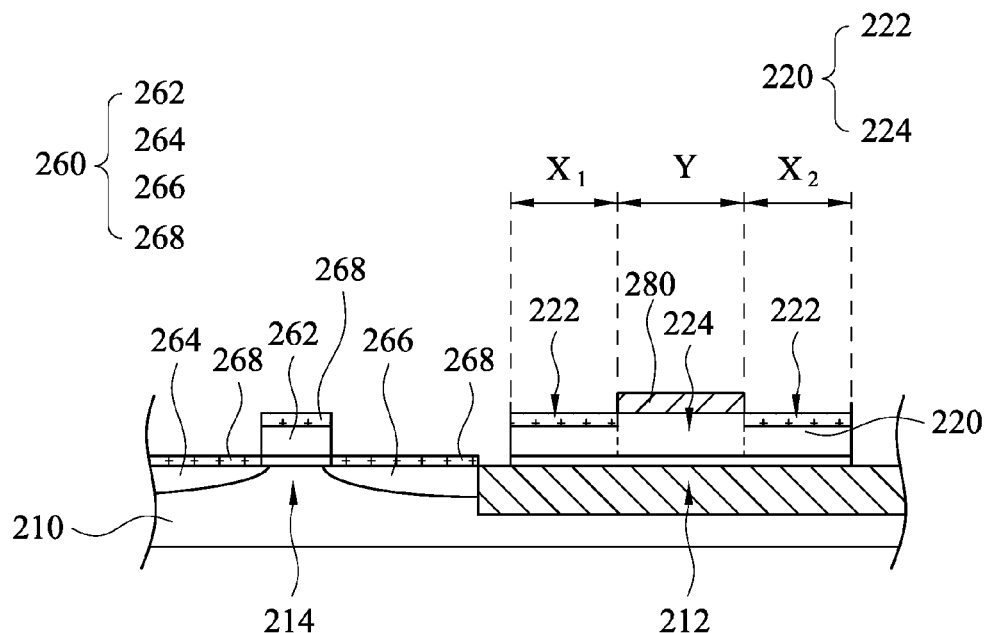
FIG. 6 is a schematic view of the substrate shown in FIG. 5 in a subsequent stage of the method of fabricating the integrated circuit according to various embodiments of the present disclosure.

FIG. 6 is a schematic view of the substrate shown in FIG. 5 in a subsequent stage of the method of fabricating the integrated circuit according to various embodiments of the present disclosure. Referring to FIG. 6, after the operation of forming at least one negative TCR portion of the polysilicon resistor, at least one positive TCR portion 222 of the polysilicon resistor 220 is formed adjacent to the negative TCR portion 224 of the polysilicon resistor 220. Therefore, the polysilicon resistor 220 having two kinds of portions, the positive TCR portion 222 and negative TCR portion 224, is capable to reduce an overall magnitude of a TCR value of the polysilicon resistor 220. The overall magnitude of the TCR value is the distance of the value from 0. A resistance of a structure with the TCR value closer to 0 will not vary as much with temperature changes as the resistance of a structure with a TCR further away from 0. The positive TCR portion 222 of the polysilicon resistor 220 could be formed by any suitable processes with proper materials. For example, the positive TCR portion 222 of the polysilicon resistor 220 could be formed with a salicide or self-aligned salicide process. In various embodiments of the present disclosure, the operation of forming at least one positive TCR portion of the polysilicon resistor is performed by a self-aligned salicide process. In the self-aligned salicide process, a layer of a transition metal is deposited over the semiconductor device. The transition metals could be selected from the group including titanium, cobalt, nickel, platinum, and tungsten. Then an annealing process such as rapid thermal annealing (RTA) is performed. The annealing process causes the transition metals to react with silicon regions to form a salicide layer. After the self-aligned salicide process is complete, an etching process could be performed to remove any remaining transition metal from the surface of the semiconductor device. Therefore, a photolithographic patterning step is not required. In addition, as shown in FIG. 6, not only the positive TCR portion 222 of the polysilicon resistor 220 is formed adjacent to the negative TCR portion 224 of the polysilicon resistor 220, but also a salicide layer 268 is also formed over the gate electrode 262, the source electrode 264 and the drain electrode 266 of the MOS transistor 260. Therefore, no additional photo mask is required for forming positive TCR portion 222 of the polysilicon resistor 220, and the process described is highly feasible using existing methods, as it is compatible with existing CMOS processes.

Figure 7:
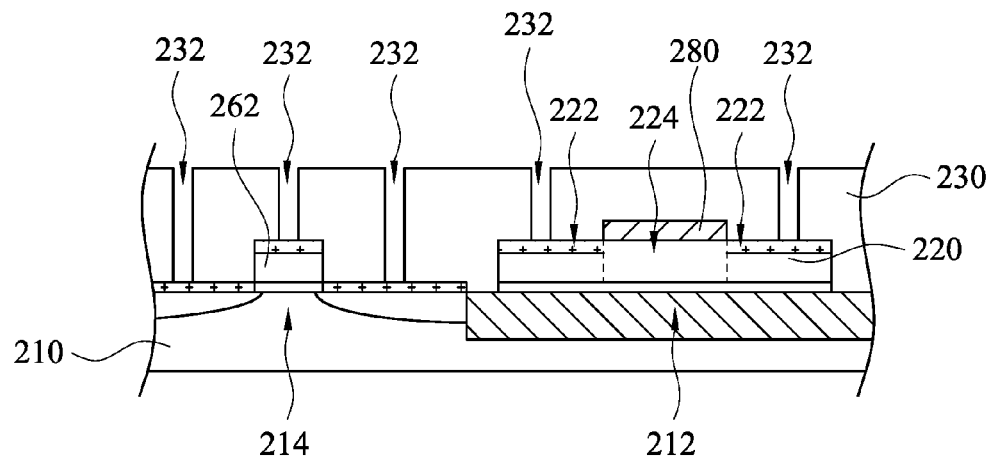
FIG. 7 is a schematic view of the substrate shown in FIG. 6 in a subsequent stage of the method of fabricating the integrated circuit according to various embodiments of the present disclosure.

FIG. 7 is a schematic view of the substrate shown in FIG. 6 in a subsequent stage of the method of fabricating the integrated circuit according to various embodiments of the present disclosure. Referring to FIG. 7, in various embodiments of the present disclosure, an inter-layer dielectric (ILD) layer 230 is deposited to cover the MOS transistor 260 and the polysilicon resistor 220. The ILD 230 could include any now known or later developed dielectric appropriate for a first contact layer such as but not limited to: silicon nitride ($Si_3N_4$), silicon oxide ($SiO_2$), fluorinated $SiO_2$ (FSG), hydrogenated silicon oxycarbide (SiCOH), porous SiCOH, boro-phosho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer materials, other low dielectric constant (<3.9) material, or layers thereof. In various embodiments of the present disclosure, the ILD layer 230 could include high dielectric (high-k) dielectrics such as metal oxides such as tantalum oxide ($Ta_2O_5$), barium titanium oxide ($BaTiO_3$), hafnium oxide ($HfO_2$), zirconium oxide ($ZrO_2$), and aluminum oxide ($Al_2O_3$). After the operation of depositing the ILD layer 230 covering the MOS transistor 260 and the polysilicon resistor 220, a plurality of openings 232 of the ILD layer 230 is formed to expose the source electrode 264, the drain electrode 266 and the gate electrode 262 of the MOS transistor 260, and the positive TCR portion 222 of the polysilicon resistor 220. The operation of forming the plurality of openings 232 of the ILD layer 230 could be performed by litho-etching processes.

Figure 8:
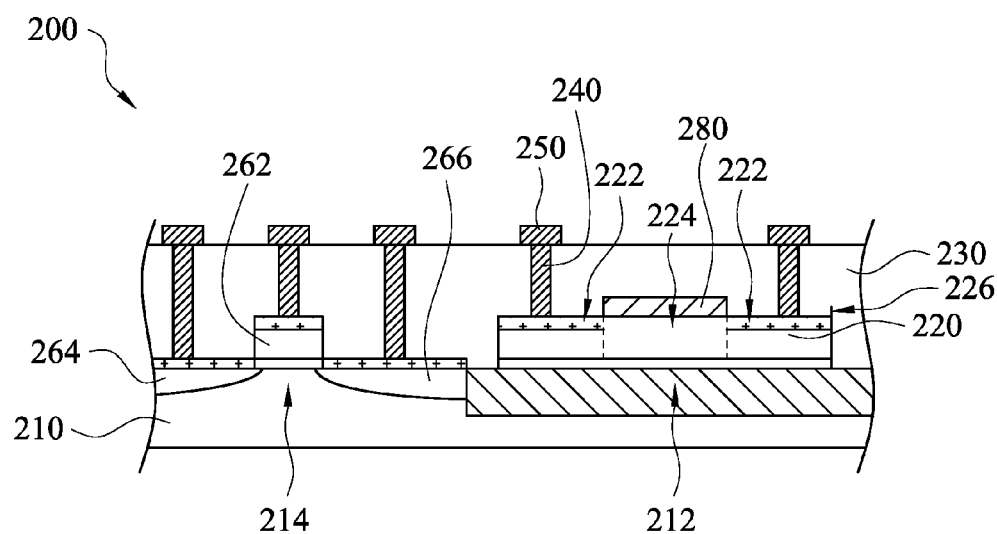
FIG. 8 is a schematic view of the substrate shown in FIG. 7 in a subsequent stage of the method of fabricating the integrated circuit according to various embodiments of the present disclosure.

FIG. 8 is a schematic view of the substrate shown in FIG. 7 in a subsequent stage of the method of fabricating the integrated circuit according to various embodiments of the present disclosure. Referring to FIG. 8, after the operation of forming the plurality of openings 232 of the ILD layer 230, contact metals 240 are formed in the openings 232 respectively. Contact metals 240 are also respectively formed in the openings 232 and electrically connected to the source region 264, the drain region 266, and the gate 262 of the MOS transistor 260, and positive TCR portions 222 of the polysilicon resistor 220. In other words, contact metals 240 are formed over and directly contact the salicide layer of the source region 264, the drain region 266, and the gate 262 of the MOS transistor 260, and positive TCR portions 222 of the polysilicon resistor 220. Contact metals 240 could include tungsten, aluminum, copper, or other suitable materials. As shown in FIG. 8, metal pads 250 are formed disposed on the ILD layer 230 and respectively electrically connected to the contact metals 240. Metal pads 250 could also include tungsten, aluminum, copper, or other suitable materials.

As illustrated in FIG. 8, an integrated circuit 200 is formed. The integrated circuit 200 includes the substrate 210 and the polysilicon resistor 220. The substrate 210 could be a semiconductor substrate including single crystalline silicon that has been slightly doped with n-type or p-type dopants. Alternatively, the substrate 210 could be a semiconductor substrate formed upon an insulation layer to create SOI devices. The polysilicon resistor 220 is disposed on the substrate 210. The polysilicon resistor 220 has at least one positive TCR portion 222 and at least one negative TCR portion 224, the positive TCR portion 222 is adjacent to the negative TCR portion 224, and the positive TCR portion 222 is in direct contact with the negative TCR portion 224. Therefore, smaller layout area is required since opposite polarities TCR is directly electrically connected. In addition, circuit complexity of the integrated circuit 200 could be further reduced since extra electrical connection between opposite polarities TCR is not required. In various embodiments of the present disclosure, the integrated circuit 200 further includes a protection layer 280 disposed on an upper surface 226 of the polysilicon resistor 220. The negative TCR portion 224 is covered by the protection layer 280, and the positive TCR portion 222 is not covered by the protection film 280. The protection layer 280 covers the negative TCR portion 224 of the polysilicon resistor 220, and therefore the negative TCR portion 224 of the polysilicon resistor 220 would be protected without being affected by following process such as salicidation process, and retains intrinsic property of polysilicon to have a TCR less than 0. The protection layer 280 could include any suitable materials. In various embodiments of the present disclosure, the protection film 280 includes resist protective oxide (RPO). As aforementioned, the positive TCR portion 222 and the negative TCR portion 224 of the polysilicon resistor 220 could be respectively fabricated in any suitable processes with proper materials. In various embodiments of the present disclosure, the positive TCR portion 222 includes salicide. Since both of salicide and RPO are commonly utilized in CMOS fabrication processes, the polysilicon resistor 220 could be fabricated in a process, which is highly compatible with existing CMOS processes without introducing new materials or extra process steps. As shown in FIG. 8, in various embodiments of the present disclosure, the substrate 210 further includes the shallow trench isolation region 212. The polysilicon resistor 220 is disposed on the shallow trench isolation region 212. The shallow trench isolation region 212 could be formed by etching a trench in the substrate 210 and thereafter filling the trench with a dielectric material. The dielectric material could be silicon oxide or silicon nitride. Therefore, the polysilicon resistor 220 could be further isolated from other devices on the substrate 210, and the performance of the polysilicon resistor 220 could be further improved. Also shown in FIG. 8, in various embodiments of the present disclosure, the integrated circuit 200 further includes at least one metal-oxide-semiconductor (MOS) transistor 260. The MOS transistor 260 has a gate electrode 262, a source electrode 264 and a drain electrode 266. The gate electrode 262 is disposed on the substrate 210. The gate electrode 262 includes polysilicon. The source electrode 264 and the drain electrode 266 are disposed in the substrate 210 on opposite sides of the gate electrode 262. It should be noticed that both the polysilicon resistor 220 and the gate electrode 262 include polysilicon. The polysilicon resistor 220 and the gate electrode 262 could be fabricated in the same operation. In other words, fabrications of the polysilicon resistor 220 could be integrated into that of the MOS transistor 260 within the integrated circuit 200. Therefore, multiple film deposition, lithography, and/or etching operations for fabricating the polysilicon resistor 220 are no longer required so that the fabrication of the integrated circuit 200 including both of the MOS transistor 260 and the polysilicon resistor 220 is simplified and the cost in fabricating of the integrated circuit 200 is significantly reduced.

Referring to FIG. 8, in various embodiments of the present disclosure, the polysilicon resistor 220 has two positive TCR portions 222 and one negative TCR portion 224 disposed between the positive TCR portions 222. As aforementioned, the negative TCR portion 224 could be defined by a protection film 280 such as a RPO film formed thereon. For example, as illustrated in FIG. 4 and FIG. 5, the protection film 280 is deposited to cover the gate electrode 262 of the MOS transistor 260 and the polysilicon resistor 220. Then the protection film 280 is litho-etched to cover the negative TCR portion 224 of the polysilicon resistor 220. Therefore, the pattern of the negative TCR portion 224 of the polysilicon resistor 220 could be precisely controlled according to various requirements. As shown in FIG. 5, a length Y of the negative TCR portion 224 of the polysilicon resistor 220 is formed. Furthermore, the litho-etched protection film 280 also exposes portions of the polysilicon resistor 220 which are not covered, such as X1 and X2 illustrated in FIG. 5, to be salicided. Therefore, as aforementioned and illustrated in FIG. 6, two positive TCR portions 222 are formed. One of the two positive TCR portions 222 has a length X1, and the other one of the two positive TCR portions 222 has a length X2. The lengths Y, X1, and X2 could be precisely controlled and adjusted according to various requirements for an overall TCR value of the polysilicon resistor 220. Therefore, the overall TCR value of the polysilicon resistor 220 could be optimized by tuning a ratio of lengths X1, X2 of the positive TCR portions 222 to the length Y of the negative TCR portion 224. In various embodiments of the present disclosure, a sum length X1+X2 of the two positive TCR portions 222 is greater than a length Y of the negative TCR portion 224. However, the present disclosure is not limited thereto, and various patterns of the positive TCR portion 222 and the negative TCR portion 224 of the polysilicon resistor 220 could be formed corresponding to various requirements.

Figure 9:
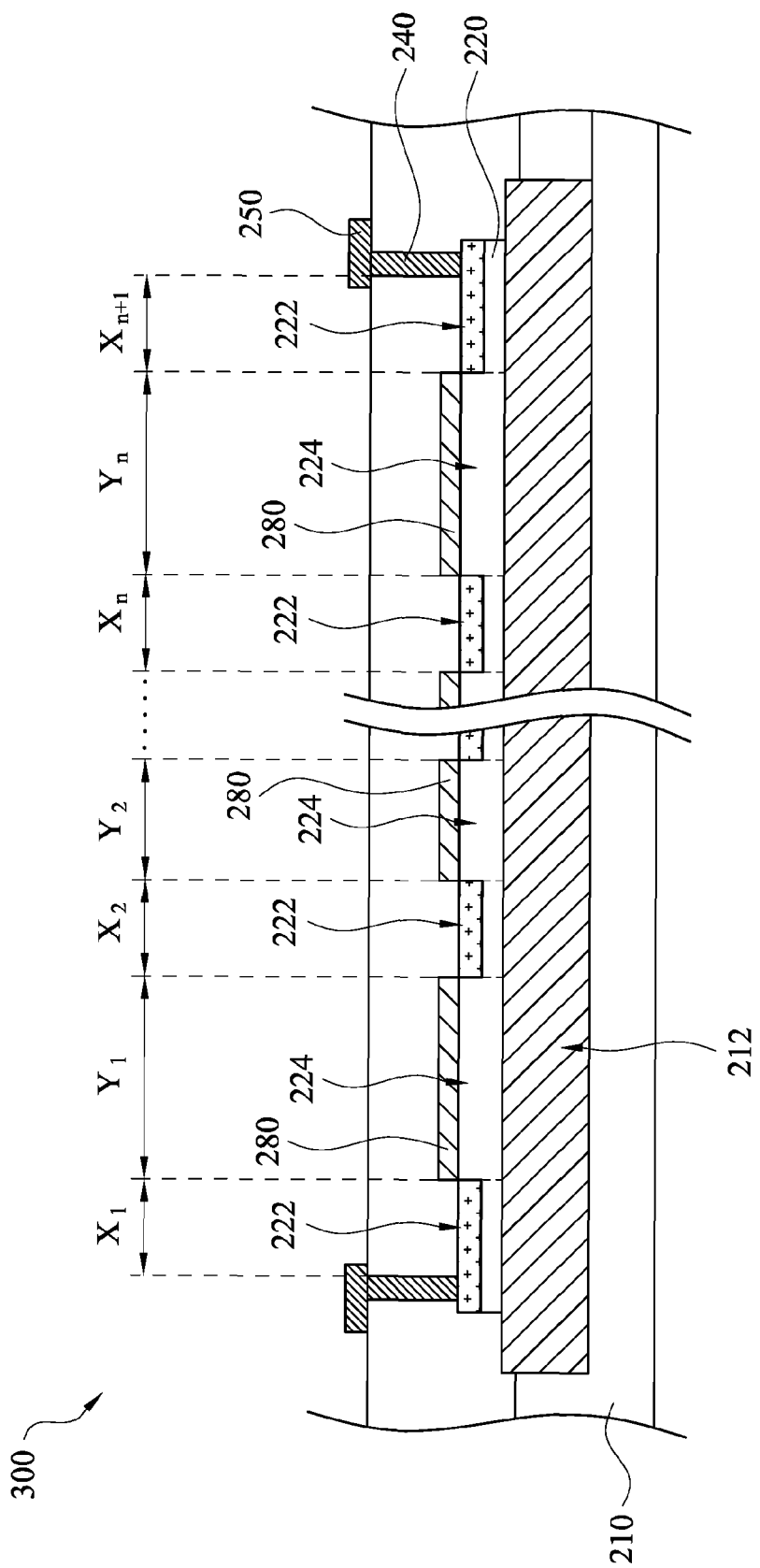
FIG. 9 is a schematic view of the substrate shown in FIG. 4 in a subsequent stage of the method of fabricating the integrated circuit according to other various embodiments of the present disclosure.
Figure 10:
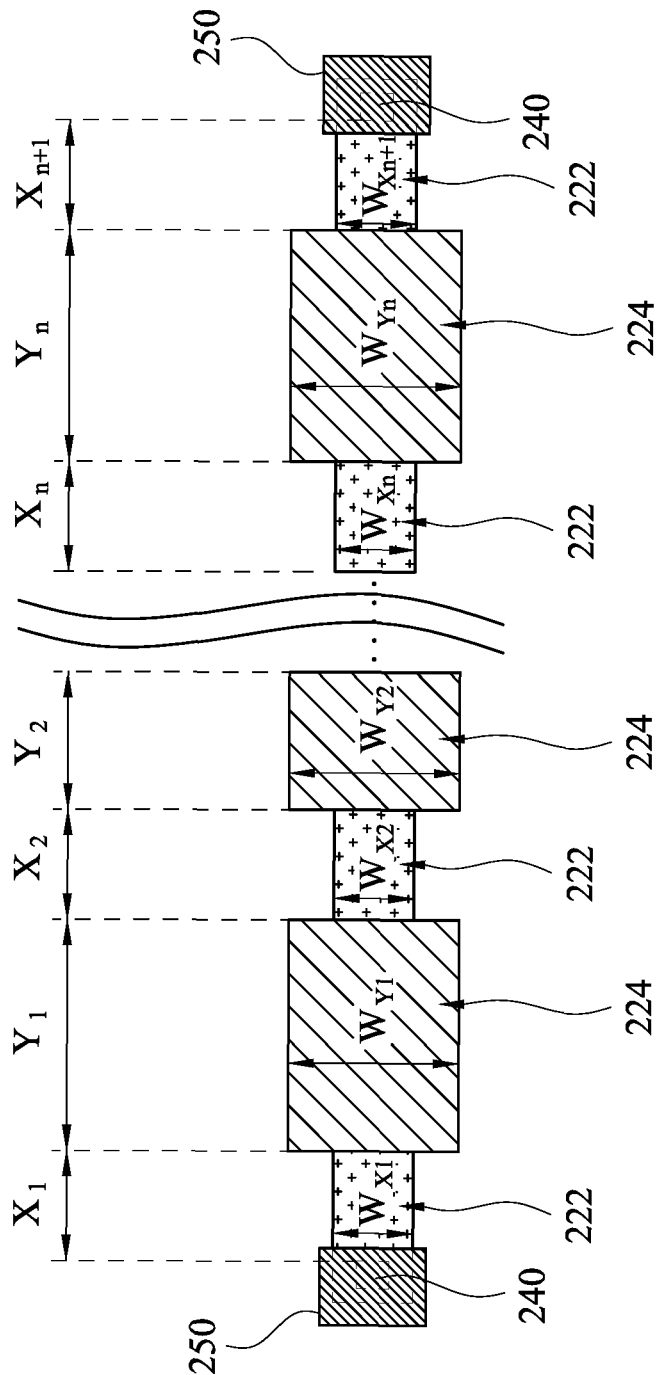
FIG. 10 is a top-view of the substrate shown in FIG. 9.

FIG. 9 is a schematic view of the substrate shown in FIG. 4 in a subsequent stage of the method of fabricating the integrated circuit according to other various embodiments of the present disclosure. FIG. 10 is a top-view of the substrate shown in FIG. 9. Referring to FIG. 9, in other various embodiments of the present disclosure, the polysilicon resistor 220 has a plurality of positive TCR portions 222 and a plurality of negative TCR portions 224. The positive TCR portions 222 and the negative TCR portions 224 are alternatively arranged. As aforementioned, the negative TCR portion 224 could be defined by a protection film 280 such as a RPO film formed thereon. For example, the protection film 280 is deposited to cover the gate electrode 262 of the MOS transistor 260 and the polysilicon resistor 220. Then the protection film 280 is litho-etched into a predetermined pattern as illustrated in FIG. 9 to cover the plurality of negative TCR portions 224 of the polysilicon resistor 220. Similarly, the pattern of the negative TCR portion 224 of the polysilicon resistor 220 could be precisely controlled according to various requirements. As shown in FIG. 9, the plurality of negative TCR portions 224 of the polysilicon resistor 220 includes the negative TCR portions 224 respectively have lengths $Y_1$ to $Y_n$, and (n could be any integers greater than 1). On the other hand, the litho-etched protection film 280 also exposes portions of the polysilicon resistor 220, which are not covered, to be salicided. Therefore, as aforementioned and illustrated in FIG. 9, the plurality of positive TCR portions 222 is formed and the plurality of positive TCR portions 222 of the polysilicon resistor 220 includes the positive TCR portions 222 respectively have lengths $X_1$ to $X_{n+1}$. The lengths $Y_1$ to $Y_n$, and $X_1$ to $X_{n+1}$ could be precisely controlled and adjusted according to various requirements for an overall TCR value of the polysilicon resistor 220. Therefore, the overall TCR value of the polysilicon resistor 220 could be optimized by tuning a ratio of lengths X1, X2 of the positive TCR portions 222 to the length Y of the negative TCR portion 224. In various embodiments of the present disclosure, a sum length $(X_1+X_2+\ldots+X_n+X_{n+1})$ of the plurality of the positive TCR portions 222 is greater than that $(Y_1+Y_2+\ldots+Y_n)$ of the plurality of the negative TCR portions 224. In addition, widths of the positive TCR portions 222 and the negative TCR portion 224 could also be precisely controlled. As illustrated in FIG. 10, the plurality of negative TCR portions 224 of the polysilicon resistor 220 includes the negative TCR portions 224 respectively have widths $W_{Y1}$ to $W_{Yn}$. The plurality of positive TCR portions 222 of the polysilicon resistor 220 includes the positive TCR portions 222 respectively have widths $W_{X1}$ to $W_{Xn+1}$. In various embodiments of the present disclosure, the positive TCR portions 222 and the negative TCR portions 224 respectively has a ratio of a length to a width. For example, the positive TCR portion 222 at left side has the ratio $(X_1/W_{X1})$ of its length $(X_1)$ to its width $(W_{X1})$. The sum of the ratios $((X_1/W_{X1})+(X_2/W_{X2})+\ldots+(X_n/W_{Xn})+(X_{n+1}/W_{Xn+1}))$ of the positive TCR portions 222 is greater than that $((Y_1/W_{Y1})+(Y_2/W_{Y2})+\ldots+(Y_n/W_{Yn}))$ of the negative TCR portions 224. Therefore, the overall TCR value of the polysilicon resistor 220 could be optimized by tuning the sum of the ratios $((X_1/W_{X1})+(X_2/W_{X2})+\ldots+(X_n/W_{Xn})+(X_{n+1}/W_{Xn+1}))$ of the positive TCR portion 222, and/or the sum of the ratios $((Y_1/W_{Y1})+(Y_2/W_{Y2})+\ldots+(Y_n/W_{Yn}))$ of the negative TCR portions 224.

As aforementioned, multiple film deposition, lithography, and/or etching operations are generally required to form the semiconductor resistors from different materials. However, such techniques can be costly and time consuming because they utilize multiple film deposition, lithography, and/or etch steps to form resistors from different materials. According to various embodiments of the present disclosure, the gate electrode of the MOS transistor and the polysilicon resistor are formed simultaneously. Therefore, additional multiple film deposition or photomask is not required for forming the polysilicon resistor. In addition, the process of fabricating the polysilicon resistor is highly feasible by using existing methods, as it is compatible with existing CMOS processes. According to various embodiments of the present disclosure, the polysilicon resistor having two kinds of portions, the positive TCR portion and negative TCR portion. Therefore, the overall magnitude of the TCR value of the polysilicon resistor could be well adjusted according to various requirements. In addition, the positive TCR portion is in direct contact with the negative TCR portion. Therefore, smaller layout area is required since opposite polarities TCR is directly connected such that the circuit complexity of the integrated circuit could be further reduced since extra electrical connections between opposite polarities TCR are not required.

According to other various embodiments of the present disclosure, the integrated circuit includes a substrate and a polysilicon resistor. The polysilicon resistor is disposed on the substrate. The polysilicon resistor has at least one positive TCR portion and at least one negative TCR portion. The positive TCR portion is adjacent to the negative TCR portion, and the positive TCR portion is in direct contact with the negative TCR portion.

According to other various embodiments of the present disclosure, the integrated circuit includes a substrate, a resistor, and at least one MOS transistor. The resistor is disposed on the substrate. The resistor has at least one positive TCR portion and at least one negative TCR portion. The positive TCR portion is adjacent to the negative TCR portion, and the positive TCR portion is in direct contact with the negative TCR portion. The MOS transistor has a gate electrode, a source electrode and a drain electrode. The gate electrode is disposed on the substrate. The source electrode and the drain electrode are disposed in the substrate on opposite sides of the gate electrode. Both of the resistor and the gate electrode of the MOS transistor includes polysilicon.

According to various embodiments of the present disclosure, a method of fabricating the integrated circuit includes depositing a polysilicon film on a substrate. The method further includes patterning the polysilicon film to form a gate electrode of a MOS transistor and a polysilicon resistor. The method further includes forming at least one negative TCR portion of the polysilicon resistor. The method further includes forming at least one positive TCR portion of the polysilicon resistor adjacent to the negative TCR portion of the polysilicon resistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   depositing a polysilicon film on a surface of a substrate;
   patterning the polysilicon film to form a gate electrode of a MOS transistor and a polysilicon resistor on the surface of the substrate;
   forming a protection film to define at least one a negative TCR portion of the polysilicon resistor; and
   forming two positive TCR portions of the polysilicon resistor, wherein the negative TCR portion of the polysilicon resistor is positioned between the two positive TCR portions, and the two positive TCR portions are in physical contact with the negative TCR portion.

2. The method of claim 1, wherein forming the protection film to define the negative TCR portion of the polysilicon resistor comprises:
   depositing the protection film covering the gate electrode of the MOS transistor and the polysilicon resistor; and
   litho-etching the protection film to cover the negative TCR portion of the polysilicon resistor.

3. The method of claim 1, wherein forming the two positive TCR portions of the polysilicon resistor is performed by a self-aligned salicide process.

4. The method of claim 3, further comprising:
   depositing a transition metal layer on the gate electrode and the polysilicon resistor;
   performing a rapid thermal annealing; and
   removing remaining transition metal layer.

5. The method of claim 1, wherein forming the two positive TCR portions of the polysilicon resistor further comprises:
   performing a salicidation process on an exposed surface of the polysilicon film.

6. The method of claim 5, wherein a salicide layer is formed on the exposed surface of the polysilicon resistor.

7. The method of claim 5, wherein the positive TCR portions and the negative TCR portion are in an alternative pattern on the polysilicon resistor.

8. The method of claim 1, further comprising:
   depositing an ILD layer covering the MOS transistor and the polysilicon resistor;
   forming a plurality of openings of the ILD layer to expose a source electrode, a drain electrode and the gate electrode of the MOS transistor, and the two positive TCR portions of the polysilicon resistor;
   forming contact metals in the openings respectively; and
   forming metal pads disposed on the ILD layer and respectively electrically connected to the contact metals.

9. The method of claim 8, wherein a depth of the plurality of openings varies.

10. The method of claim 8, wherein each of the metal pads is electrically connected to an immediately underlying contact metal.

11. The method of claim 8, wherein the contact metals and metal pads are positioned over the polysilicon film.

12. The method of claim 8, wherein the ILD layer over the negative TCR portion remains intact.

13. The method of claim 1, wherein the substrate further comprises a shallow trench isolation region and an active region, and the gate electrode of the MOS transistor is formed on the active region and the polysilicon resistor is formed on the shallow trench isolation region.

14. The method of claim 13, wherein depositing the polysilicon film on the surface of the substrate further comprises:
   depositing a gate dielectric layer covering the shallow trench isolation region and the active region.

15. The method of claim 1, wherein the positive TCR portions are abreast to the negative TCR portion on the polysilicon resistor.

16. The method of claim 1, wherein the protection film comprises resist protective oxide.

17. The method of claim 1, wherein the negative TCR portion and the positive TCR portions of the polysilicon resistor have different dimensions.

18. The method of claim 1, wherein a length and a width of each of the positive and negative TCR portions of the polysilicon resistor are varied.

19. A method, comprising:
   depositing a polysilicon film over a substrate;
   patterning the polysilicon film;
   defining a negative TCR portion on the polysilicon film; and
   performing salicide treatment on the remaining surface of the polysilicon film to form two positive TCR portions, wherein the negative TCR portion is flanked by the two positive TCR portions.

20. A method, comprising:
   defining at least one negative TCR portion on a polysilicon film; and
   forming at least one positive TCR portion on the remaining surface of the polysilicon film, wherein a sum of ratios of a length and a width of the negative TCR portions is different from a sum of ratios of a length and a width of the positive TCR portions.

* * * * *